United States Patent
Kondo et al.

(10) Patent No.: US 10,163,469 B2
(45) Date of Patent: Dec. 25, 2018

(54) SYSTEM AND METHOD FOR WRITE DATA BUS CONTROL IN A STACKED MEMORY DEVICE

(71) Applicant: Micron Technology, Inc., Boise, ID (US)

(72) Inventors: Chikara Kondo, Hachioji (JP); Tomoyuki Shibata, Kokubunji (JP); Chiaki Dono, Chigasaki (JP); Seiji Narui, Sagamihara (JP); Minehiko Uehara, Komae (JP); Taihei Shido, Sagamihara (JP); Homare Sato, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/365,563

(22) Filed: Nov. 30, 2016

(65) Prior Publication Data

US 2018/0151207 A1 May 31, 2018

(51) Int. Cl.
| | | |
|---|---|---|
| *G11C 7/10* | (2006.01) | |
| *G11C 19/28* | (2006.01) | |
| *G11C 7/22* | (2006.01) | |

(52) U.S. Cl.
CPC ............ *G11C 7/1087* (2013.01); *G11C 7/106* (2013.01); *G11C 7/109* (2013.01); *G11C 7/1039* (2013.01); *G11C 7/1066* (2013.01); *G11C 7/1093* (2013.01); *G11C 7/222* (2013.01); *G11C 19/28* (2013.01); *G11C 2207/108* (2013.01); *G11C 2207/2272* (2013.01)

(58) Field of Classification Search
CPC ....... G11C 8/18; G11C 7/1087; G11C 7/1012; G11C 7/1036; G11C 19/28
See application file for complete search history.

(56) References Cited

U.S. PATENT DOCUMENTS

| | | | |
|---|---|---|---|
| 2011/0087811 A1* | 4/2011 | Kondo | G06F 1/12 710/71 |
| 2011/0093735 A1* | 4/2011 | Yoko | G06F 1/10 713/500 |
| 2012/0127812 A1* | 5/2012 | Nishioka | G11C 7/1093 365/194 |

(Continued)

*Primary Examiner* — Ajay Ojha
(74) *Attorney, Agent, or Firm* — Dorsey & Whitney LLP

(57) ABSTRACT

Apparatuses and methods for transmitting data between a plurality of chips are described. An example apparatus includes: a first chip, wherein the first chip includes a receiver that receives a data strobe signal and further generates an internal strobe signal responsive, at least in part, to the data strobe signal, the internal strobe signal including a first edge and a second edge following the first edge; a buffer circuit coupled to a set of input terminals and captures first data at the set of input terminals responsive, at least in part, to the first edge of the internal strobe signal and further captures second data at the set of input terminals responsive, at least in part, to the second edge of the internal strobe signal; a driver coupled between the buffer circuit and a set of data terminals and configured to be activated to provide the first and second data from the buffer circuit to the set of data terminals responsive, at least in part, to a control signal; and a width expanding circuit that provides the control signal responsive, at least in part, to the internal strobe signal.

16 Claims, 12 Drawing Sheets

(56) References Cited

U.S. PATENT DOCUMENTS

| | | | |
|---|---|---|---|
| 2012/0195090 A1* | 8/2012 | Hayashi | G11C 5/02 365/63 |
| 2012/0250387 A1* | 10/2012 | Kondo | G11C 5/02 365/51 |
| 2013/0258788 A1 | 10/2013 | Ide et al. | |
| 2014/0003168 A1* | 1/2014 | Lee | G11C 7/22 365/189.15 |
| 2015/0213860 A1* | 7/2015 | Narui | G11C 7/22 365/51 |
| 2017/0103816 A1* | 4/2017 | Okuno | G11C 16/32 |
| 2017/0287546 A1* | 10/2017 | Ryu | G06F 1/08 |

* cited by examiner

SYSTEM AND METHOD FOR WRITE DATA BUS CONTROL IN A STACKED MEMORY DEVICE

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips vertically and interconnecting the chips using through substrate vias (TSVs) between an interface (I/F) chip and core chips. FIG. 1 is a block diagram of an apparatus including a memory controller 1 and a memory device 10. The memory device 10 may include an interface chip 2 and a plurality of core chips 3 CC0-CC3. Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

In a 3D memory device as described, each chip, such as the interface chip or each core chip, may include a first-in-first-out (FIFO) type of buffer for write data. The FIFO type of buffer may receive write data responsive to a write data strobe signal (WDQS) and may provide an output signal responsive to an output clock signal. Thus, in the 3D memory device, the write data may be transmitted via two FIFO type of buffers, one in the interface chip and the other in the corresponding core chip. However, the FIFO type of buffers delays the output signal because of waiting for a timing of being output responsive to the output clock signal. Furthermore, the FIFO type of buffer in the interface chip may be redundant for being responsive to an output clock signal in the interface chip, because another FIFO type of buffer in the core chip that receives the write data from the interface chip provides the write data responsive to an output clock signal in the core chip. Thus, the write data from the FIFO type of buffer in the core chip is eventually adjusted based on the output clock signal in the core chip.

For example, High Bandwidth Memory (HBM) is a type of memory including a high-performance DRAM interface and vertically stacked DRAM. A typical HBM stack of four DRAM core chips contains two channels per chip, and each of the two channels includes 128 bit I/Os. The typical HBM stack may contain a total of eight input/output channels and a width of 1024 bits in total. An interface (I/F) chip of the HBM provides an interface with the eight input/output channels, which function independently of each other. Thus, the above 3D memory device may be include a substantially large number of data terminals (DQs) (e.g., 1024 DQs) in the interface chip. Because the FIFO type of buffer is provided for each data terminal, the large number of the FIFO type buffers may cause a larger layout size, in addition to the delay to write data signals provided to the core chips.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
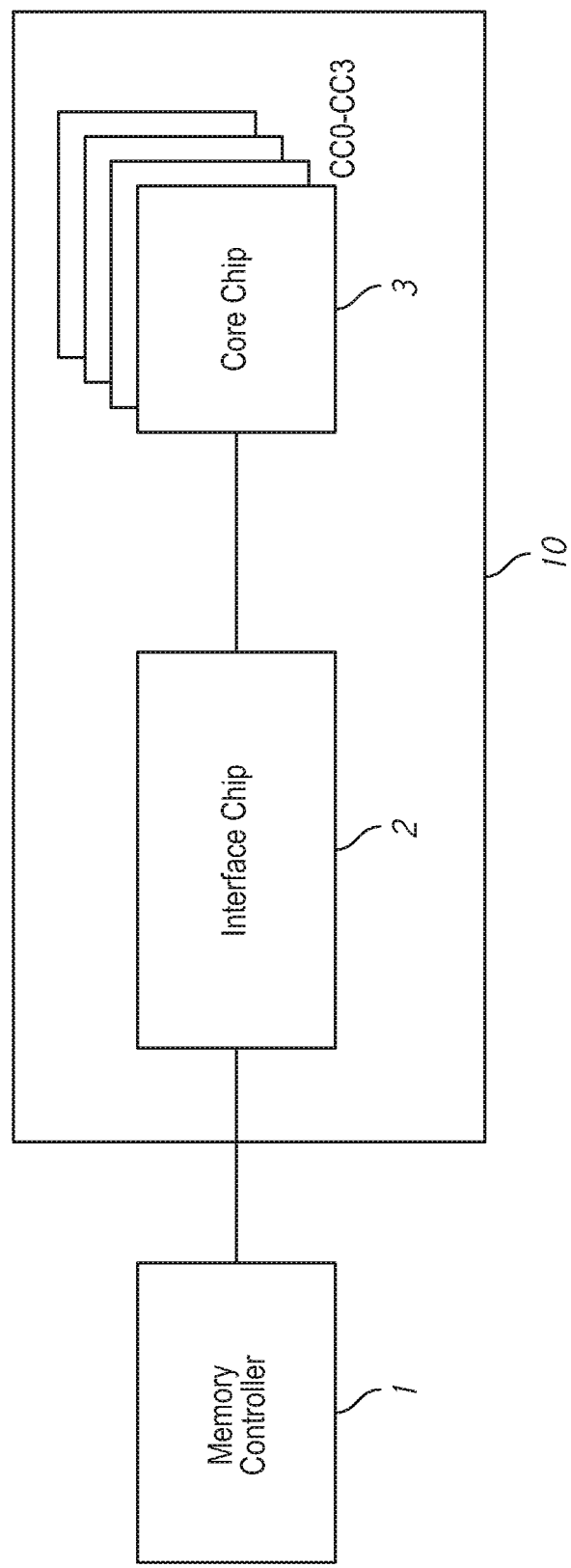
FIG. 1 is a block diagram of an apparatus including a memory controller and a memory device.
Figure 2A:
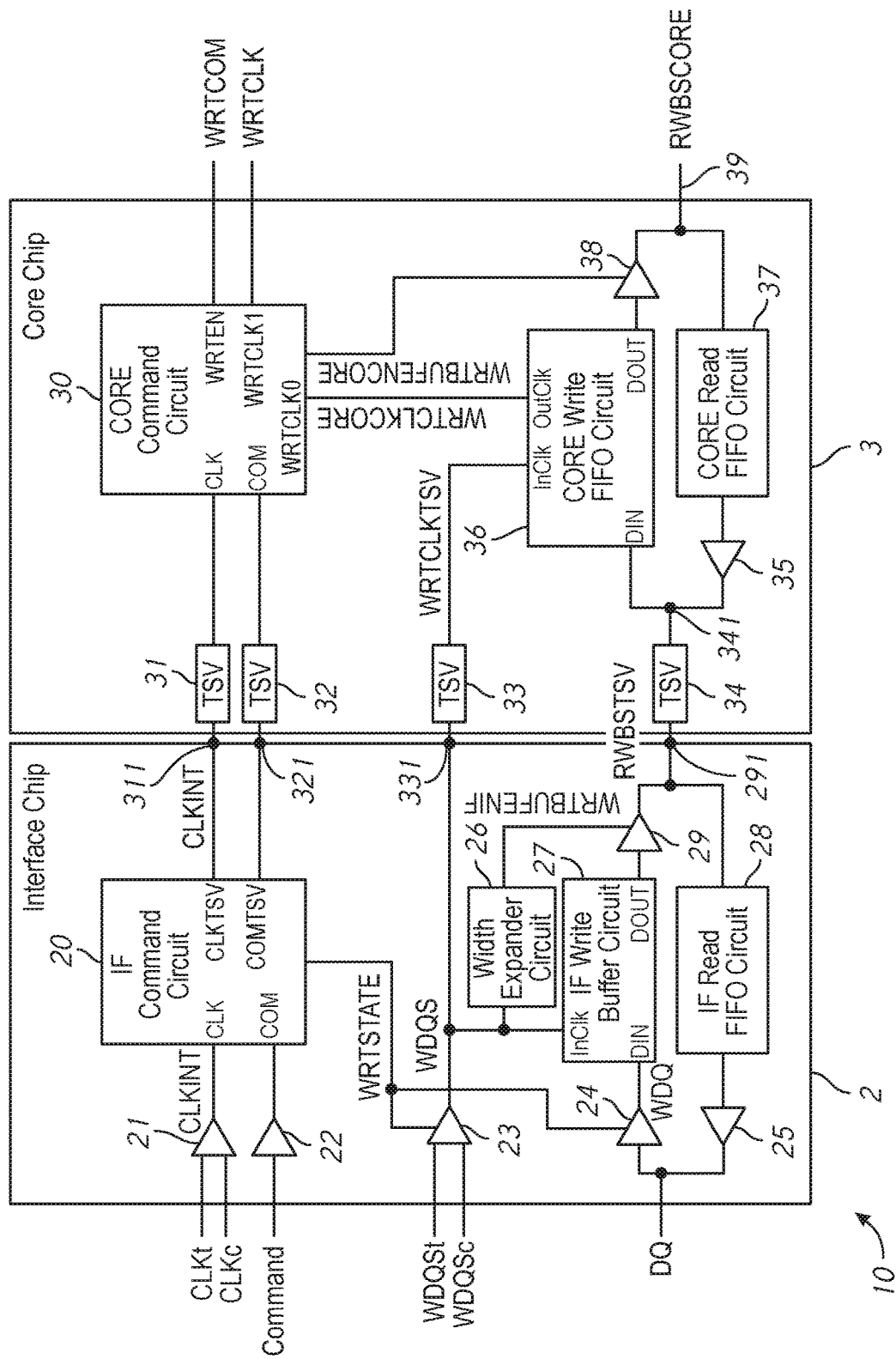
FIG. 2A is a schematic diagram of an interface (IF) chip and a core chip in a memory device, in accordance with an embodiment of the present disclosure.
Figure 2B:
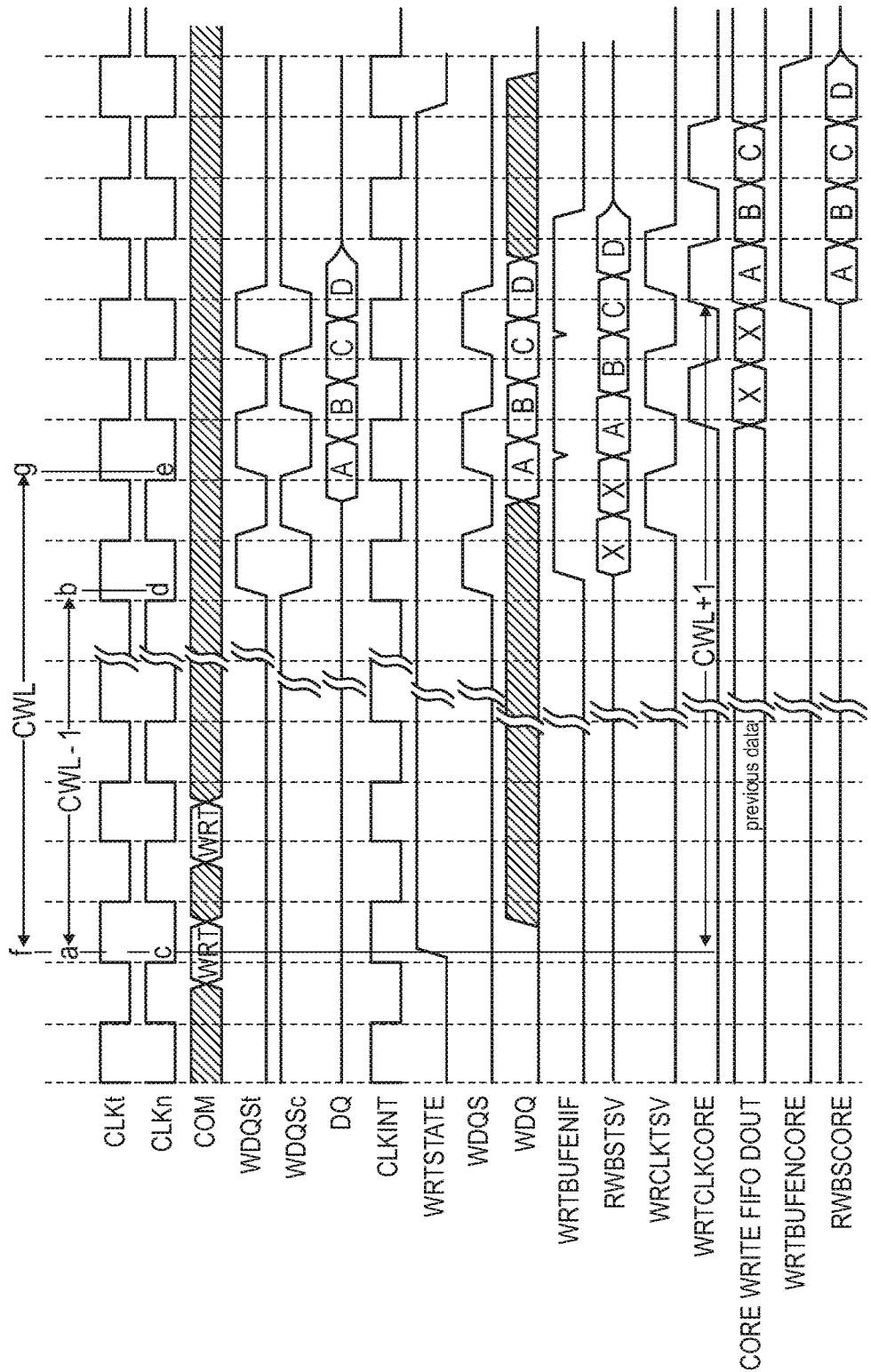
FIG. 2B is a timing diagram of signals in the interface (IF) chip and the core chip in the memory device of FIG. 2A, in accordance with an embodiment of the present disclosure.

FIG. 2A is a schematic diagram of an interface (IF) chip 2 and a core chip 3 in a memory device 10, in accordance with an embodiment of the present disclosure. FIG. 2B is a timing diagram of the interface (IF) chip 2 and the core chip 3 in the memory device 10 of FIG. 2A, in accordance with an embodiment of the present disclosure. For example, the memory device 10 may be an HBM, an HMC, a Wide-IO DRAM, etc. The memory device 10 may include the interface chip 2 and a plurality of core chips 3 stacked with each other. The memory device 2 may include conductive vias (TSVs) 31, 32, 33, 34 (e.g., through substrate electrodes or through silicon vias) which couple the interface chip 2 and core chips 3 by penetrating the core chips 3 and coupling to a clock terminal 311, a command terminal 321, a data strobe terminal 331 and a set of data terminals 291 of the interface chip 2, respectively. Also, the interface chip 2 may include a set of TSVs at a core chip side coupled to an upper core chip, and the plurality of core chips 3 may include the TSVs 31, 32, 33, 34 at a core chip side coupled to the upper core chip instead of an interface chip side coupled to the interface chip 2.

In the interface chip 2, an IF command circuit 20 may receive an internal clock signal CLKINT through a buffer 21 that receives complementary clock signals CLKt and CLKc provided to the memory device 10. The IF command circuit 20 may provide the internal clock signal CLKINT from a CLKTSV node thereof to the TSV 31 via the clock terminal 311. The IF command circuit 20 may receive a command signal COM through a buffer 22. The IF command circuit 20 may provide the command signal COM from a COMTSV node thereof to the TSV 32 via the command terminal 321. Responsive to the command signal COM indicative of a command (e.g., a write command WRT for executing a write operation) at Time "a" in FIG. 2B, a write state signal WRTSTATE may be activated (e.g., from a logic low level to a logic high level) at Time "c" in FIG. 2B. The write state signal WRTSTATE may be provided to an enable node of a buffer 24 for write data and an enable node of a buffer 23, which may function as a strobe receiver, for an internal write data strobe signal WDQS. The strobe receiver 23 may receive active write data strobe signals WDQSt and WDQSc to the memory device 10, with a delay. The delay may be represented by a latency that is a number of cycles included in the delay due to an address strobe command latency. For example, a delay for a column address strobe (CAS) for the writing operation (e.g., Time "g" in FIG. 2B) may be represented by a CAS write latency (CWL) from the write command WRT (e.g., Time "f" in FIG. 2B, that may correspond to Time "a") on the command signal COM. The delay to for the write data of the buffer 23 to be activated (e.g., Time "b" in FIG. 2B) may be represented as (CWL−1) cycles from the command signal COM (e.g., Time "a" in FIG. 2B) indicative of the write command. The buffer 23 may provide the internal write data strobe signal WDQS to a width expander circuit 26 (e.g. from Time "d"), a clock input (InClk) node of an IF write buffer circuit 27 and to a clock input (InClk) node of a core write FIFO circuit 36 via the data strobe terminal 331 of the interface chip 2 and the TSV 33 in the core chip 3, responsive to the active write state signal WRTSTATE.

Responsive to the activated write state signal WRTSTATE, the buffer 24 may provide write data WDQ from a data terminal DQ to a data input (DIN) node of the IF write buffer circuit 27. For example, the write data WDQ having a preamble signal may be provided from the buffer 24 to the IF write buffer circuit 27, until a first pulse (i.e. a first half cycle) of the internal write data strobe signal WDQS. After the first pulse, with the column address strobe (CAS) write latency (CWL) from the command signal COM indicative of the write command (e.g., at Time "e"), the buffer 24 may provide a first write data (A) responsive to a first predetermined edge (e.g., a second rising edge of WDQSt or a second falling edge of WDQSc), a second write data (B) responsive to a second predetermined edge (e.g., a second falling edge of WDQSt or a second rising edge of WDQSc), a third write data (C) responsive to a third predetermined edge (e.g., a third rising edge of WDQSt or a third falling edge of WDQSc), and a fourth write data (D) responsive to a fourth predetermined edge (e.g., a third falling edge of WDQSt or a third rising edge of WDQSc). The IF write buffer circuit 27 may capture the write data WDQ at the DIN node, responsive to the internal write data strobe signal WDQS received at the InClk node, and may further provide the write data WDQ to a buffer 29 from a data output (DOUT) node. The width expander circuit 26 may receive the internal write data strobe signal WDQS and provide a write buffer enable IF signal WRTBUFENIF that is active (e.g., at a logic high level) to control an enable node of the buffer 29 for enabling the buffer 29, responsive to the internal write data strobe signal WDQS.

The buffer 29 may function as a driver that is activated to provide a read/write bus TSV signal RWBSTSV to a set of data terminals 291 responsive to the active WRTBUFENIF signal. The set of data terminals 291 of the IF chip 2 may be coupled to a TSV 34 in the core chip 3. The read/write bus TSV signal RWBSTSV may include data from the DOUT node of the IF write buffer circuit 27. For example, the buffer 29 may provide "don't care data (X)" associated with the preamble signal until the end of the first active cycle of the write buffer enable IF signal WRTBUFENIF. The buffer 29 may provide the first write data (A) and the second write data (B) responsive to the second active cycle of the write buffer enable IF signal WRTBUFENIF. The buffer 29 may provide the third write data (C) and the fourth write data (D) responsive to the third active cycle of the write buffer enable IF signal WRTBUFENIF. Thus, the buffer 29 may provide the don't care data and the first to fourth data to the TSV 34. On the other hand, the buffer 29 may be set to a high impedance state if the WRTBUFENIF signal is deactivated (e.g., at a logic low level). If the command signal COM is indicative of a read command for executing a read operation, together with the deactivated WRTBUFENIF signal, read data from the TSV 34 may be transmitted to the IF read FIFO circuit 28 and the IF read FIFO circuit 28 may provide the read data to the data terminal DQ via a buffer 25.

In the core chip 3, a core command circuit 30 may receive the internal clock signal CLKINT from the IF command circuit 20 through the TSV 31. The core command circuit 30 may receive the command signal COM from the IF command circuit 20 through the TSV 32. The core command circuit 30 may provide a write internal clock signal WRTCLKCORE responsive to the command signal COM indicative of a write command and the internal clock signal CLKINT. The WRTCLKCORE signal may have the same cycle as the internal clock signal CLKINT while being activated, with a delay equivalent to the CWL cycles relative to the command signal COM indicative of the write command for executing a write operation. The core command circuit 30 may provide an active write command enable signal WRTCOM from a WRTEN node and a WRTBUFENCORE node, responsive to the command signal COM indicative of the write command. The active write command enable signal WRTCOM signal on the WRTBUFENCORE node may be activated with a delay equivalent to a (CWL+1)

cycles relative to the command signal COM indicative of the write command. Thus, the core command circuit 30 may provide the active write command enable signal WRTCOM signal after a predetermined number of cycles (e.g., one cycle) of providing the active WRTCLKCORE signal, responsive to the command signal COM. For example, the predetermined number of cycles may be determined to cover preamble cycles of core data to be provided from the IF chip 2.

The TSV 34 may provide the core data from the IF chip 2, including the don't care data (X) in the preamble cycle and the first to forth write data (A to D), on the RWBSTSV signal to a data input (DIN) node 341 of the core write FIFO circuit 36, with a delay due to the TSV 34 relative to the RWBSTSV signal, responsive to the RWBSTSV signal. The core read FIFO circuit 36 may receive a write data strobe signal WRTCLKTSV that may have a delay relative to the internal write date strobe signal WDQS due to the TSV 33 from the TSV 33 at the InClk node. The write data strobe signal WRTCLKTSV may include a first pulse for the don't care data (X) in a first cycle (e.g., the preamble cycle), a second pulse for the first and second data (A and B) to be received in a second cycle, and a third pulse for the third and fourth data (C and D) to be received in a third cycle. The core write FIFO circuit 36 may receive the WRTCLKCORE signal, which is independent from the write data strobe signal WRTCLKTSV, at an OutClk node. Because the WRTCLKCORE signal may be activated with the CWL delay, the core write FIFO circuit 36 may provide the don't care data and the first to fourth data received at the DIN node 341 to a buffer 38 from a data output (DOUT) node, responsive to the WRTCLKCORE signal. For example, the buffer 38 may be a tri-state buffer. The buffer 38 may provide a signal from the DOUT node of the core write FIFO circuit 36 as a read/write bus core signal RWBSCORE throughout a core read/write bus through one or more core chips, responsive to the active WRTBUFENCORE signal. Because the WRTBUFENCORE signal has the delay equivalent to the CWL+1 cycles relative to the command signal COM, whereas the WRTCLKCORE signal has the delay of CWL cycles, the don't care data in the first cycle of the signal from the DOUT node may not be provided by the buffer 38, and the first data to fourth data (A to D) maybe provided as the read/write bus core signal RWBSCORE.

Figure 3A:
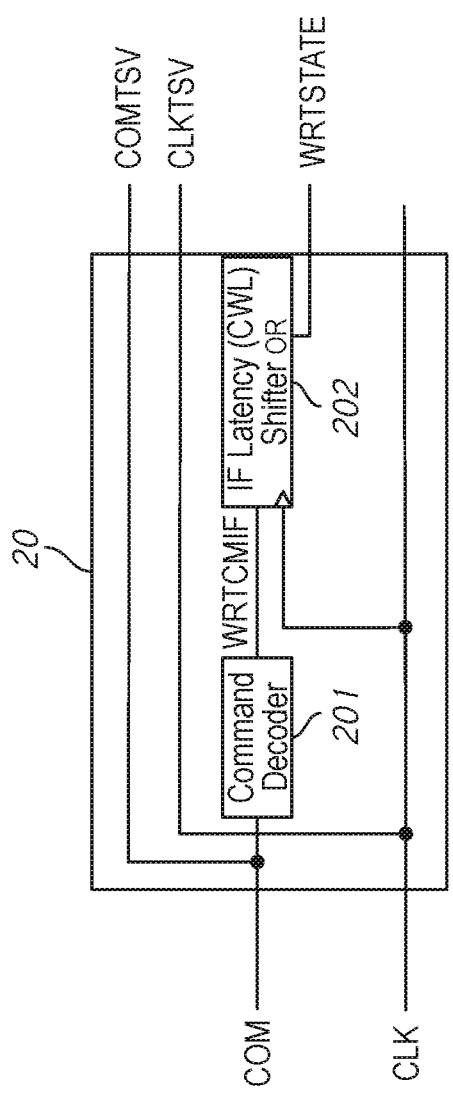
FIG. 3A is a block diagram of an interface (IF) command circuit in the IF chip of FIG. 2A, in accordance with an embodiment of the present disclosure.

FIG. 3A is a block diagram of an interface (IF) command circuit 20 in the IF chip 2 of FIG. 2A, in accordance with an embodiment of the present disclosure. The IF command circuit 20 may receive the internal clock signal CLKINT at a CLK node and may further provide the internal clock signal CLKINT to the CLKTSV node. The IF command circuit 20 may receive the command signal COM at a COM node and may further provide the command signal COM to the COMTSV node.

The IF command circuit 20 may include a command decoder 201. The command decoder 201 may receive the command signal COM from the COM node of the IF command circuit 20. The command decoder 201 may decode the command signal COM to obtain a command. If the command is indicative of the write command for executing the write operation, the command decoder 201 may provide an IF write command signal WRTCMIF that is active (e.g., at a logic high level).

Figure 3B:
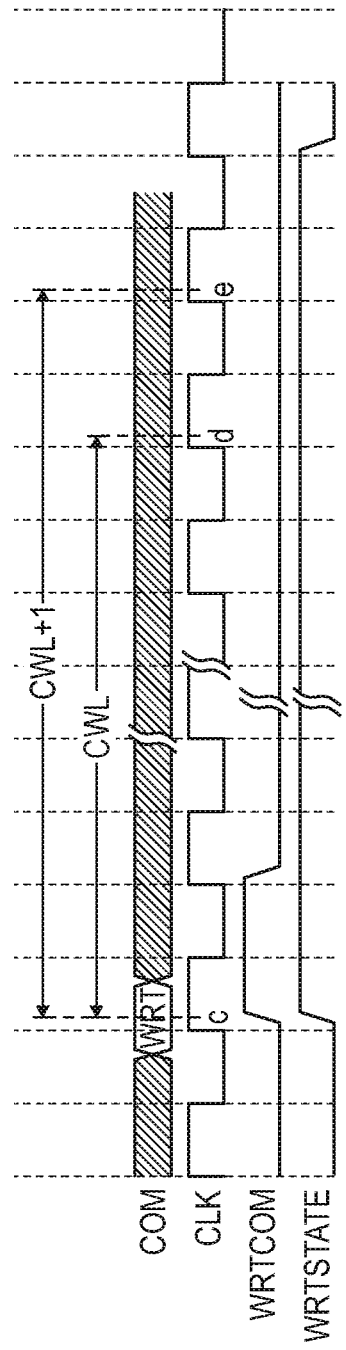
FIG. 3B is a timing diagram of signals in the IF command circuit of FIG. 3A, in accordance with an embodiment of the present disclosure.
Figure 3C:
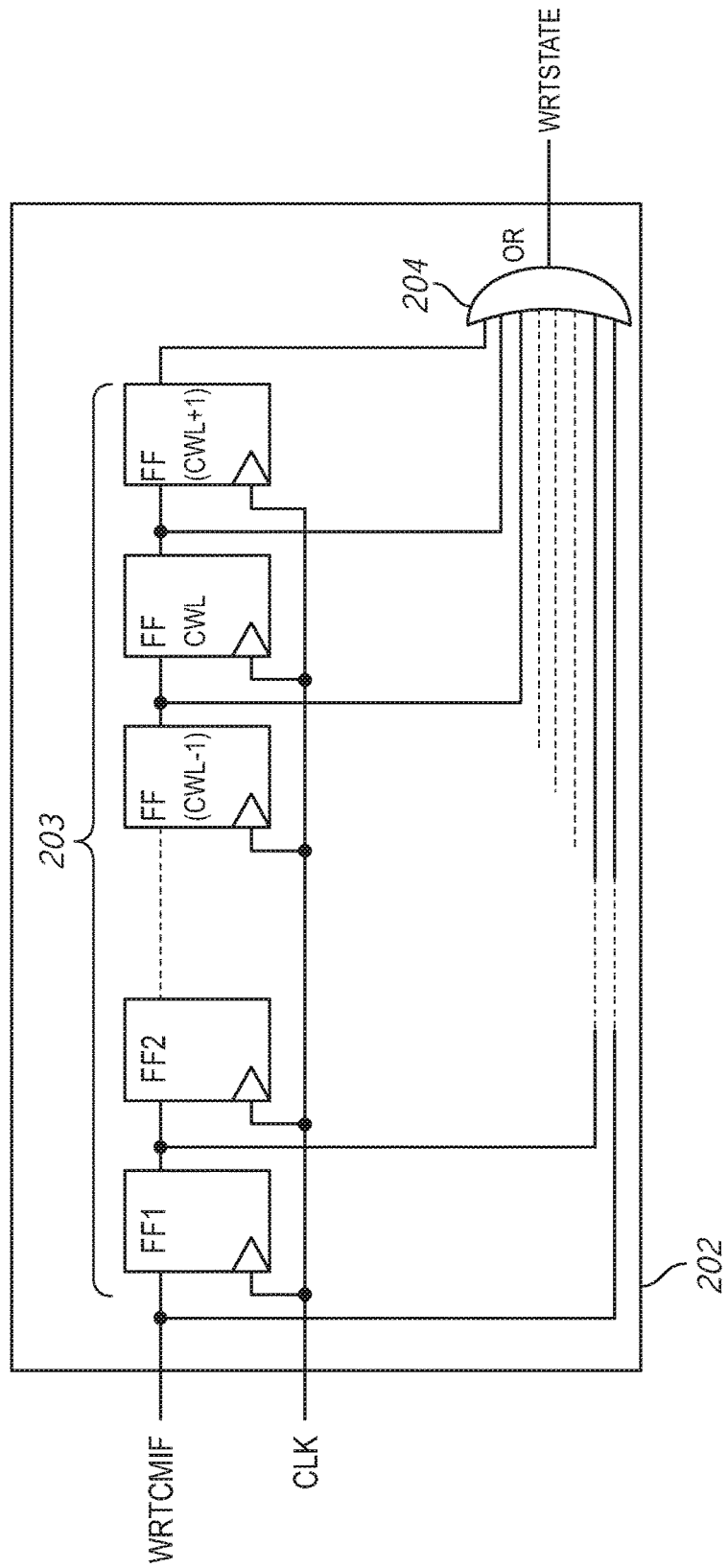
FIG. 3C is a block diagram of an interface (IF) latency shifter in the IF command circuit, in accordance with an embodiment of the present disclosure.

FIG. 3B is a timing diagram of signals in the IF command circuit 20 of FIG. 3A, in accordance with an embodiment of the present disclosure. FIG. 3C is a block diagram of an interface (IF) latency shifter 202 in the IF command circuit 20, in accordance with an embodiment of the present disclosure. The IF latency shifter 202 may provide an active write state signal WRTSTATE at an OR node. The active write state signal WRTSTATE may have an active period for a predetermined latency, responsive to the active WRTCMIF signal and further responsive to the internal clock signal CLKINT. For example, the predetermined latency may be a column address strobe (CAS) write latency (CWL) (e.g., from Time "c" to Time "d" in FIG. 3B) plus one clock cycle, which is (CWL+1) cycles (e.g., from Time "c" to Time "e" in FIG. 3B). For example, the IF latency shifter 202 may be a shift register which includes a plurality of flip-flop circuits 203 in a cascade connection. The write command signal WRTCOM is provided to an input node of a flip-flop circuit FF1 that is in a first stage of the plurality of flip-flop circuits 203 in the cascade connection. Each flip flop circuit of the plurality of flip-flop circuits 203 may receive the internal clock signal CLKINT at a clock node. An output node of each flip flop circuit of the plurality of flip-flop circuits 203 may be coupled to an input node of a flip flop circuit in a next stage of the plurality of flip-flop circuits 203 in the cascade connection. The IF latency shifter 202 may include an OR circuit 204 which may have a plurality of input nodes coupled to a plurality of corresponding output nodes of the plurality of flip-flop circuits 203. Since the plurality of flip-flop circuits 203 may operate in synchronization with the internal clock signal CLKINT, the OR circuit 204 may provide the write state signal WRTSTATE, which is a result of a logical OR operation of signals on the plurality of input nodes, to the OR node of the IF latency shifter 202. For example, the write state signal WRTSTATE may have an active period for (CWL+1) cycles. The number "CWL+1" of the flip flop circuits 203 corresponds to a period of (CWL+1) cycles that is the latency represented by the write state signal WRTSTATE in the active state. The write state signal WRTSTATE may be provided to the enable node of the buffer 23 for the internal write data strobe signal WDQS and the enable node of the buffer 24 for write data in FIG. 2A.

Figure 4B:
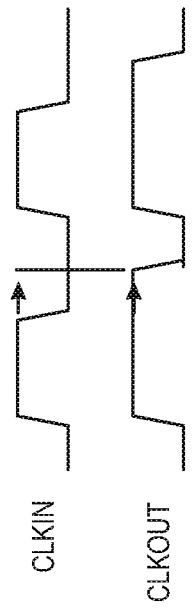
FIGS. 4B and 4C are timing diagrams of clock signals in the width expander circuit of FIG. 4A, in accordance with an embodiment of the present disclosure.
Figure 4C:
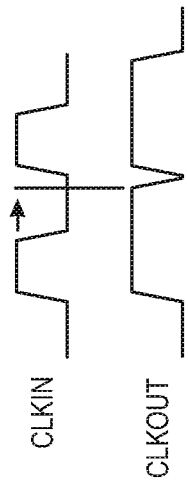
Figure 4A:
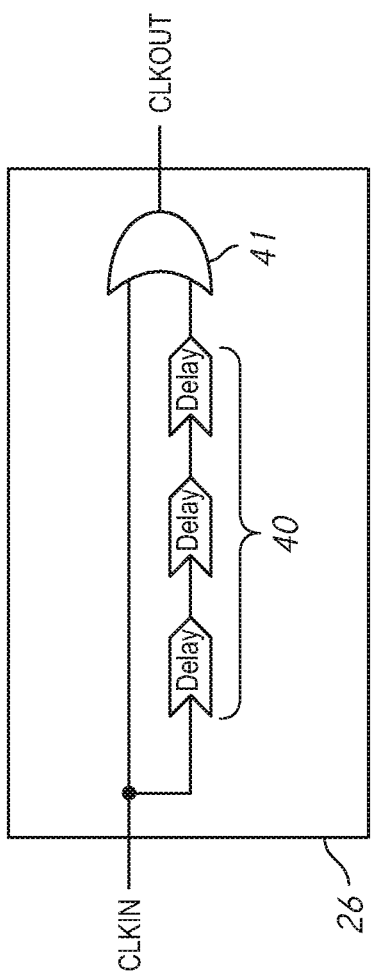
FIG. 4A is a block diagram of a width expander circuit in the IF chip of FIG. 2A, in accordance with an embodiment of the present disclosure.

FIG. 4A is a block diagram of a width expander circuit 26 in the IF chip 2 of FIG. 2A, in accordance with an embodiment of the present disclosure. The width expander circuit 26 may receive the internal write data strobe signal WDQS at a CLKIN node and provide the write buffer enable IF signal WRTBUFENIF that is active (e.g., at a logic high level) at a CLKOUT node, to the enable node of the buffer 29 in order to control enabling/disabling the buffer 29. For example, the width expander circuit 26 may include one or more delay circuits 40 that cause a delay that corresponds to an additional pulse width after expansion to the internal write data strobe signal WDQS to be added, and provide the write buffer enable IF signal WRTBUFENIF having an active pulse width that is longer than an active pulse width of the internal write data strobe signal WDQS. FIGS. 4B and 4C are timing diagrams of clock signals in the width expander circuit 26 of FIG. 4A, in accordance with an embodiment of the present disclosure. FIG. 4B includes a timing chart of one cycle of the internal write data strobe signal WDQS at the CLKIN node and the write buffer enable IF signal WRTBUFENIF at the CLKOUT node while a clock frequency of the internal write data strobe signal WDQS is low. As shown in FIG. 4B, a pulse width after the expansion with the delay may not cover a whole cycle, if the clock frequency is low. FIG. 4C includes a timing chart of one cycle of the internal write data strobe signal WDQS at the CLKIN node and the write buffer enable IF signal WRTBUFENIF at the CLKOUT node while the clock frequency of the internal write data strobe signal WDQS is high. The pulse width after the expansion with the same delay may cover almost an entire cycle, if the clock frequency is high and the clock cycle is short, as shown in FIG. 4C. In order to provide the write buffer enable IF signal WRTBUFENIF to ensure all the write data (A, B, C, D) to be transmitted, it may be preferable to cover almost the entire cycle. The delay may not be designed to exceed the clock cycle.

Figure 5A:
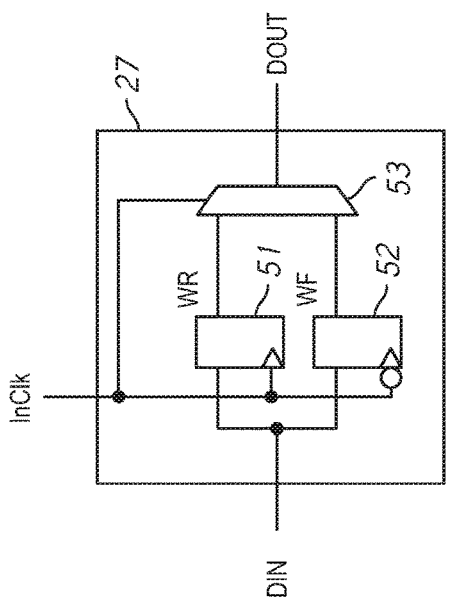
FIG. 5A is a block diagram of an interface (IF) write buffer circuit in the IF chip of FIG. 2A, in accordance with an embodiment of the present disclosure.
Figure 5B:
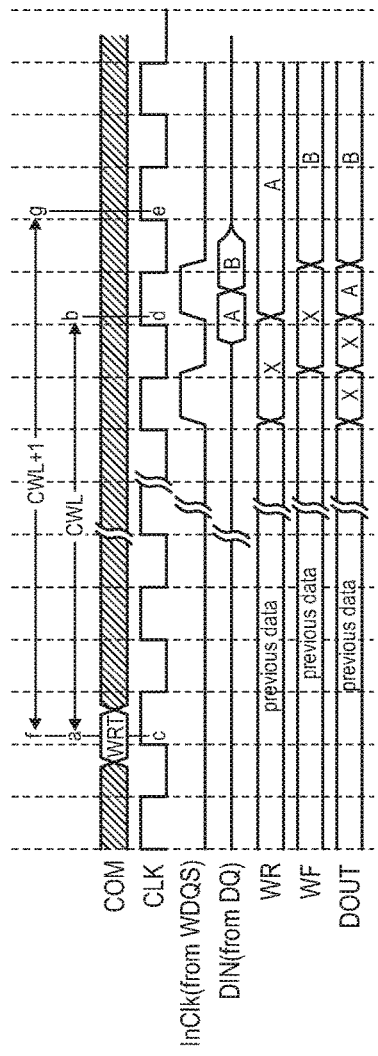
FIG. 5B is a timing diagram of signals in the IF write buffer circuit of FIG. 5A, in accordance with an embodiment of the present disclosure.

FIG. 5A is a block diagram of an interface (IF) write buffer circuit 27 in the IF chip 2 of FIG. 2A, in accordance with an embodiment of the present disclosure. FIG. 5B is a timing diagram of signals in the IF write buffer circuit 27 of FIG. 5A, in accordance with an embodiment of the present disclosure. For example, the command signal COM may include two consecutive write commands WRT. The write data signal WDQ may include write data (A and B) and the internal write data strobe signal WDQS may include two cycles corresponding to a preamble signal followed by two bytes to be transmitted in one cycle. The IF write buffer circuit 27 may receive the write data signal WDQ at the DIN node, responsive to the internal write data strobe signal WDQS received at the InClk node, and may further provide the write data signal WDQ to the buffer 29 from the DOUT node. For example, the IF write buffer circuit 27 may include a couple of flip-flop circuits 51 and 52. The flip-flop circuit 51 may receive the internal write data strobe signal WDQS at a clock node. The flip-flop circuit 51 may latch first data on the write data signal WDQ at a data node, responsive to rising edges of the internal write data strobe signal WDQS, and may provide the don't care data X followed by the write data, such as A, on the WDQ signal at rising edges of the internal write data strobe signal WDQS as a WR signal. The flip-flop circuit 52 may receive an inverted signal of the internal write data strobe signal WDQS at a clock node. The flip-flop circuit 52 may latch second data on the write data WDQ at a data node, responsive to rising edges of the inverted write data signal strobe signal that are falling edges of the internal write data strobe signal WDQS, and may provide the don't care data X followed by the write data, such as B, on the WDQ signal at falling edges of the internal write data strobe signal WDQS as a WF signal.

The IF write buffer circuit 27 may include a multiplexer 53. The multiplexer 53 may receive the WR signal and the WF signal, and may provide the WR signal responsive to an active state (e.g., a logic high level) of the internal write data strobe signal WDQS received at the InClk node, and provide the WF signal responsive to an inactive state (e.g., a logic low level) of the internal write data strobe signal WDQS received at the InClk node. The multiplexer 53 may provide the don't care data X for the first cycle of the internal write data strobe signal WDQS. The multiplexer 53 may provide the write data A at an active state of the second cycle and the write data B at an inactive state of the second cycle. Thus, the IF write buffer circuit 27 may provide the write data A and B preceded by the don't care data X from the DOUT node. Thus, the IF write buffer circuit 27 may capture the write data A responsive, at least in part, to the rising edge of the internal write data strobe signal WDQS and further captures the write data B responsive, at least in part, to the falling edge of the internal write data strobe signal WDQS.

Figures 6A, 6B:
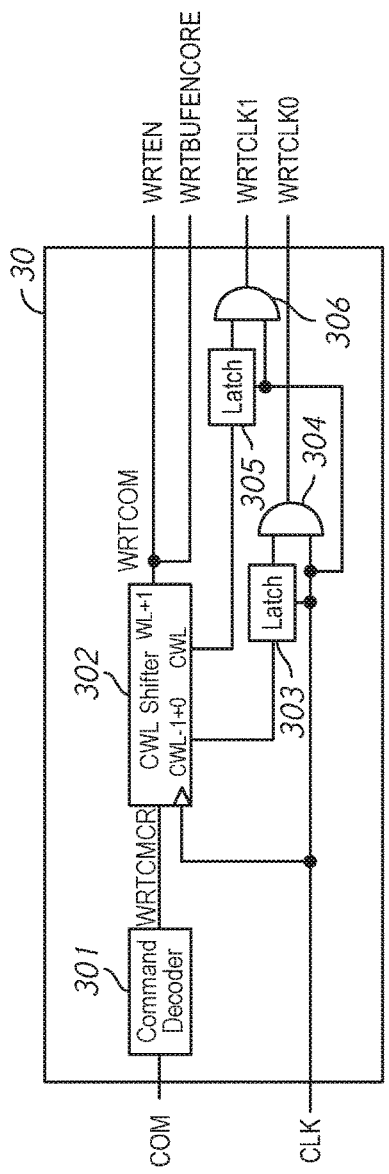
FIG. 6A is a block diagram of a core command circuit in the core chip of FIG. 2A, in accordance with an embodiment of the present disclosure.
FIG. 6B is a block diagram of a core latency shifter in the core command circuit, in accordance with an embodiment of the present disclosure.

FIG. 6A is a block diagram of a core command circuit 30 in the core chip 3 of FIG. 2A, in accordance with an embodiment of the present disclosure. The core command circuit 30 may receive the internal clock signal CLKINT at a CLK node. The core command circuit 30 may receive the command signal COM at a COM node. The core command circuit 30 may include a command decoder 301. The command decoder 301 may receive the command signal COM from the COM node of the core command circuit 30. The command decoder 301 may decode the command signal COM to obtain a command. If the command is indicative of the write command for executing the write operation, the command decoder 201 may provide a write command core signal WRTCMCR that is active (e.g., at a logic high level) to a core latency shifter 302.

Figure 6C:
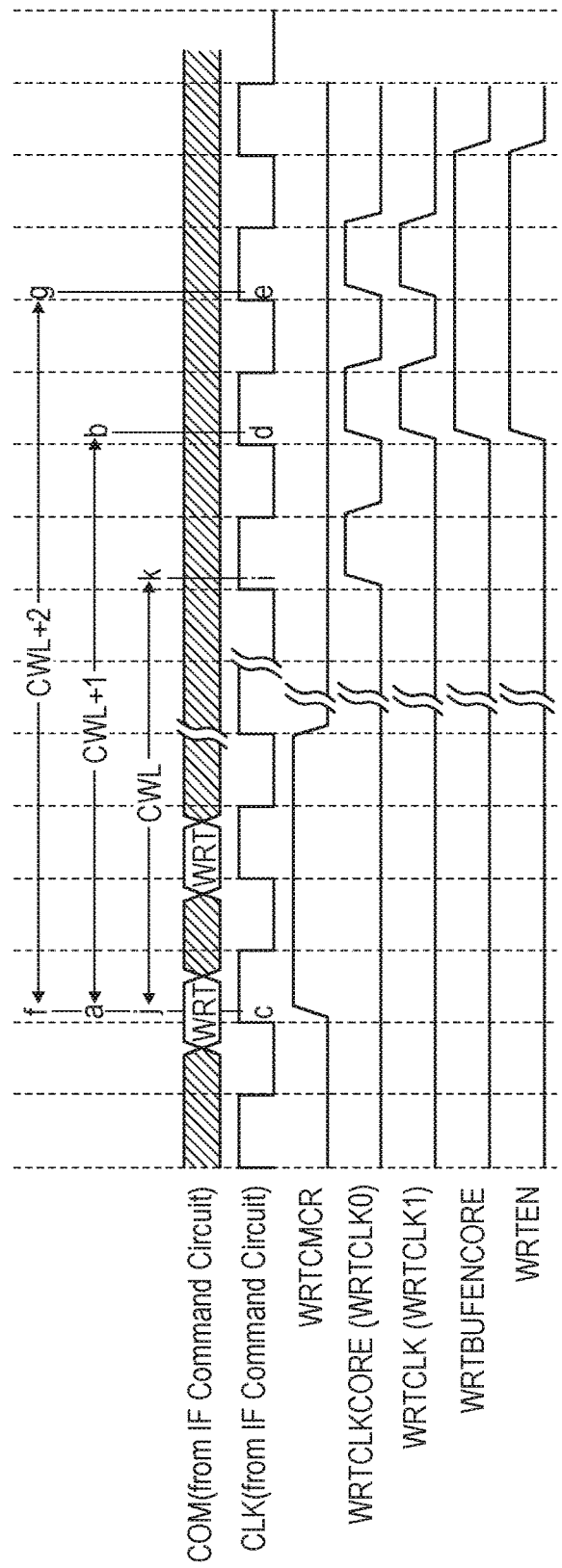
FIG. 6C is a timing diagram of signals in the core command circuit of FIG. 6A, in accordance with an embodiment of the present disclosure.

FIG. 6B is a block diagram of the core latency shifter 302 in the core command circuit 30, in accordance with an embodiment of the present disclosure. FIG. 6C is a timing diagram of signals in the core command circuit 30 of FIG. 6A, in accordance with an embodiment of the present disclosure. In response to two consecutive write commands WRT including in the command signal COM, as shown in FIG. 5C, the command decoder 301 may provide the write command core signal WRTCMCR that has been active for two cycles. The core latency shifter 302 may receive the write command core signal WRTCMCR, and the internal clock signal CLKINT at a CLK node. The core latency shifter 302 may provide one or more enable signals associated with predetermined latencies, responsive to the active WRTCMCR signal and further responsive to the internal clock signal CLKINT. For example, the predetermined latencies may include a column address strobe (CAS) write latency (CWL) (e.g., from Time "j" to Time "k" in FIG. 6C) plus one clock cycle, which is (CWL+1) cycles (e.g., from Time "a" to Time "b" in FIG. 6C). For example, the core latency shifter 302 may be a shift register which includes a plurality of flip-flop circuits 307 in a cascade connection. The write command signal WRTCMCR is provided to an input node of a flip-flop circuit FF1 that is in a first stage of the plurality of flip-flop circuits 307 in the cascade connection. Each flip flop circuit of the plurality of flip-flop circuits 307 may receive the internal clock signal CLKINT at a clock node. An output node of each flip flop circuit of the plurality of flip-flop circuits 203 may be coupled to an input node of a flip flop circuit in a next stage of the plurality of flip-flop circuits 307 in the cascade connection. The core latency shifter 302 may include an OR circuit 308 which may have a plurality of input nodes coupled to an output node of a flip-flop circuit FF(CWL−1) 307 in the "(CWL−1)-th" stage and an output node of a flip-flop circuit FFCWL 307 in the "(CWL)-th" stage, to receive a latency signal corresponding to (CWL−1) cycles and a latency signal corresponding to (CWL) cycles, respectively. Since the plurality of flip-flop circuits 307 may operate in synchronization with the internal clock signal CLKINT, the OR circuit 308 may provide a latency sum signal (CWL−1+0) at a "CWL−1+0" node of the core latency shifter 302, which has an active period for three cycles (e.g., from Time "i" to an end of a cycle that starts from Time "e" in FIG. 6C) as a result of an OR operation of the latency signal corresponding to (CWL−1) and the latency signal corresponding to (CWL) cycles. Because each output signal of the plurality of the flip-flop circuits FF(CWL−1) (e.g., which is active from Time "i" to from Time "e" in FIG. 6C) and FFCWL 307 may have a pulse width (e.g., an active period) of two cycles (e.g., from Time "d" to the end of a cycle that starts from Time "e" in FIG. 6C) where the active period of the flip-flop circuit FFCWL 307 has one cycle delay relative to the active period of the flip-flop circuit FF(CWL−1) 307, the active periods may be overlapped for one cycle. The number "CWL+1" of the flip flop circuits 307 corresponds to (CWL+1) cycles and a flip-flop circuit FF(CWL+1) 307 may provide an active write command enable signal WRTCOM from a CWL+1 node representing a CWL plus one cycle (CWL+1) latency, having a pulse width of two cycles, responsive to the two consecutive write commands WRT. The core command circuit 30 may provide the active write command enable signal WRTCOM from a WRTEN node and a WRTBUFEN-CORE node, responsive to the command signal COM indicative of the write command. The CWL shifter 302 may also provide a column address strobe (CAS) write latency (CWL) signal from the output node of FFCWL 307.

The core command circuit 30 may include a latch 303 that may receive the latency sum signal (CWL−1+0) responsive to the internal clock signal from the CLK node of the core command circuit 30. An AND circuit 304 may receive an output signal from the latch 303 and the internal clock signal from the CLK node of the core command circuit 30 and may further provide an output signal that is the WRTCLKCORE signal on a WRTCLK0 node. The WRTCLKCORE signal may be a cyclic signal having the same cycle as the internal clock signal CLKINT for three cycles while being activated, with a delay equivalent to the CWL cycles relative to the command signal COM indicative of the write command, responsive to the internal clock signal CLKINT and the pulse width of three cycles due to the latency sum signal (CWL−1+0).

The core command circuit 30 may include another latch 305 that may receive the CAS write latency (CWL) signal responsive to the internal clock signal from the CLK node of the core command circuit 30. Another AND circuit 306 may receive an output signal from the latch 305 and the internal clock signal from the CLK node of the core command circuit 30 and may further provide an output signal that is the WRTCLK signal on a WRTCLK1 node. The WRTCLK signal may be a cyclic signal having the same cycle as the internal clock signal CLKINT for two cycles while being activated, with a delay equivalent to the (CWL+1) cycles relative to the command signal COM indicative of the write command, responsive to the internal clock signal CLKINT and the pulse width of two cycles due to the CAS write latency (CWL) signal.

Figure 7A:
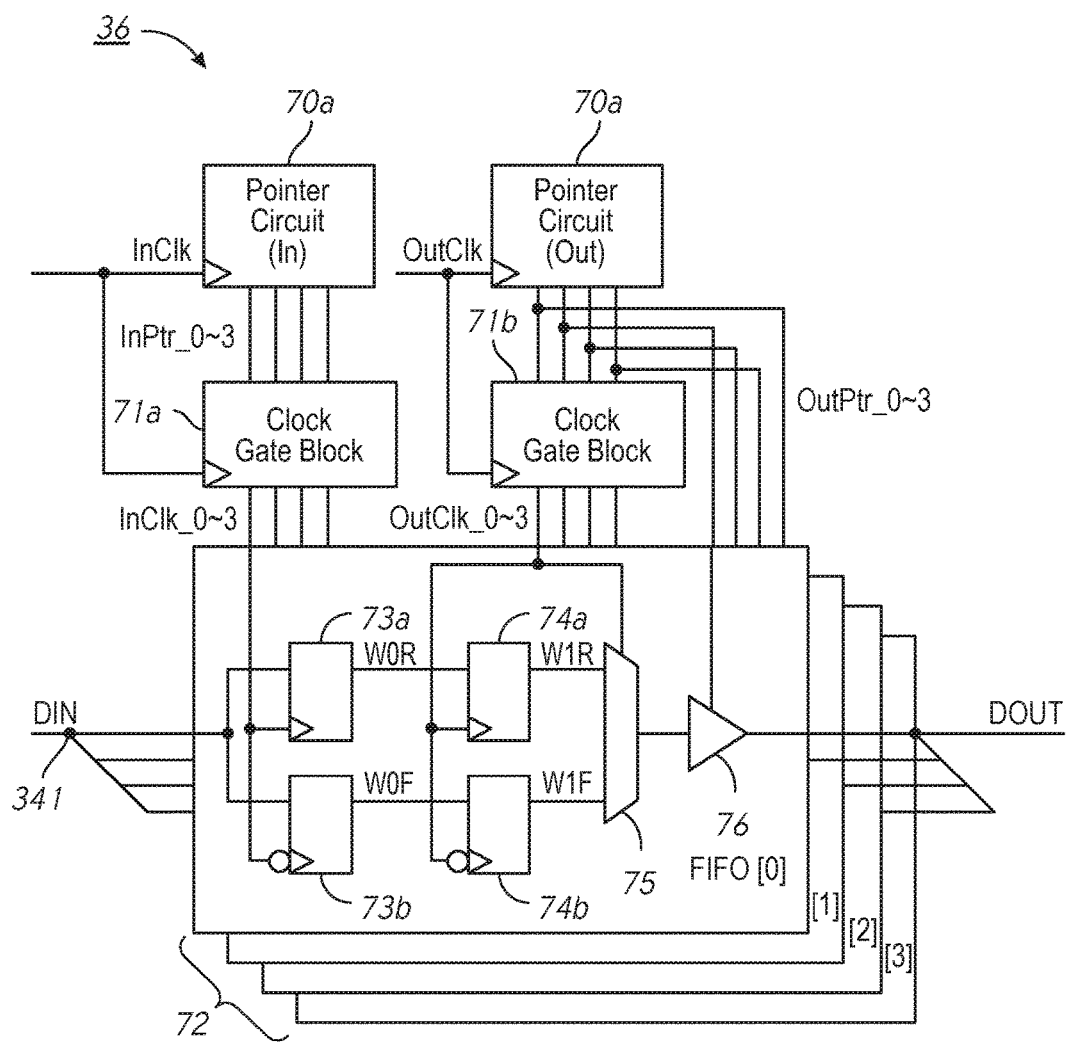
FIG. 7A is a block diagram of a core write FIFO circuit in the core chip of FIG. 2A, in accordance with an embodiment of the present disclosure.
Figure 7B:
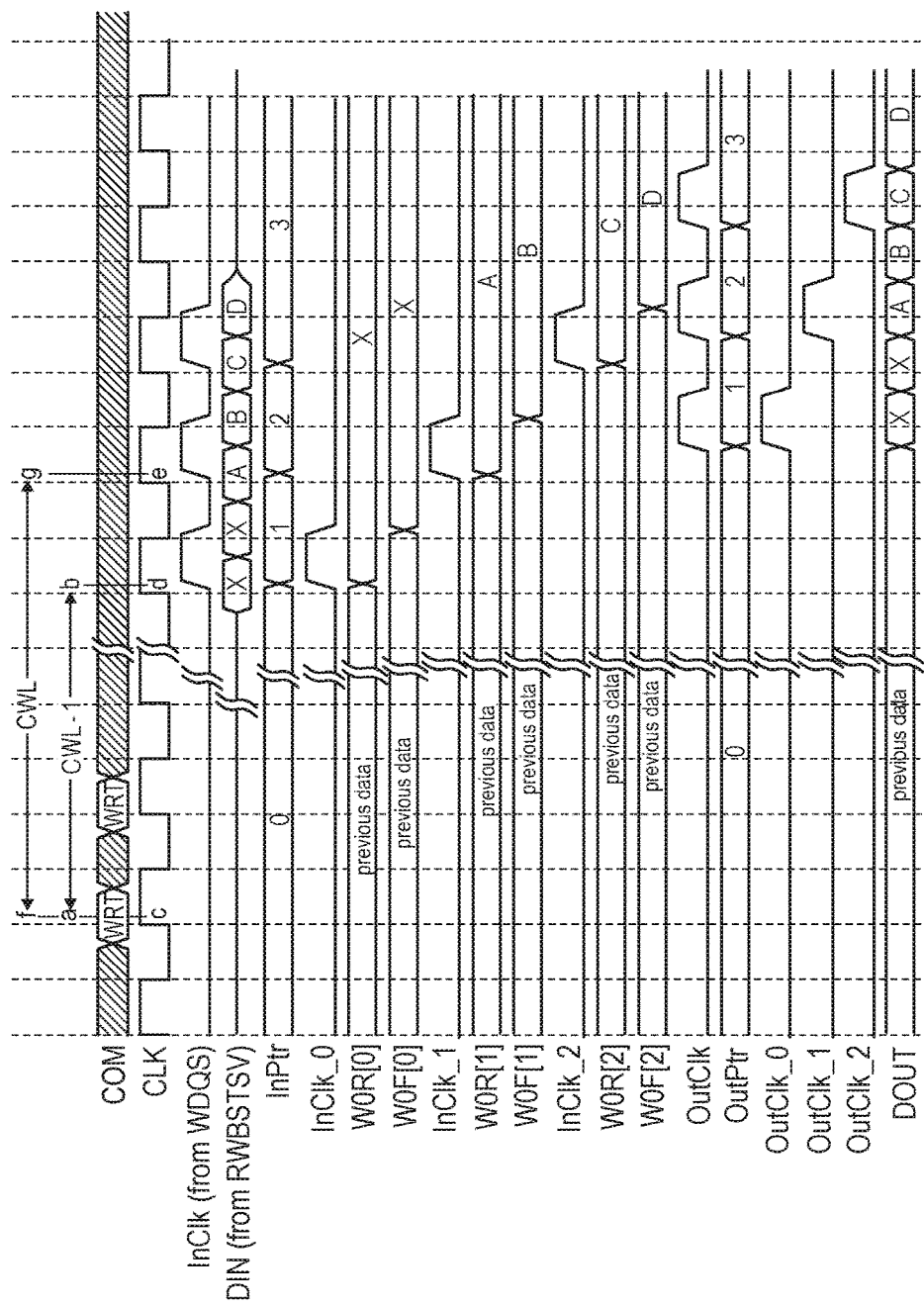
FIG. 7B is a timing diagram of signals in the core write FIFO circuit, in accordance with an embodiment of the present disclosure.

FIG. 7A is a block diagram of a core write FIFO circuit 36 in the core chip 3 of FIG. 2A, in accordance with an embodiment of the present disclosure. FIG. 7B is a timing diagram of signals in the core write FIFO circuit 36, in accordance with an embodiment of the present disclosure.

Figure 7C:
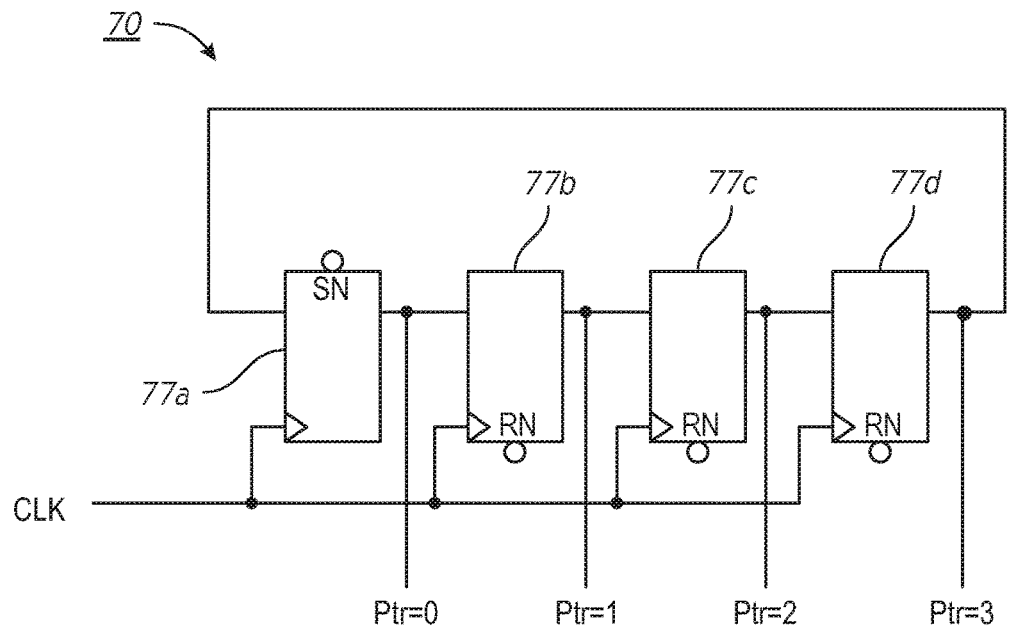
FIG. 7C is a block diagram of a pointer circuit in the core write FIFO circuit, in accordance with an embodiment of the present disclosure.

The core write FIFO circuit 36 may include a pointer circuit (IN) 70a and a pointer circuit (OUT) 70b. FIG. 7C is a block diagram of a pointer circuit 70 (e.g., the pointer circuit 70a, the pointer circuit 70a) in the core write FIFO circuit 36, in accordance with an embodiment of the present disclosure. For example, the pointer circuit 70 may include a plurality of flip-flop circuits 77a to 77d in a cascade connection. The pointer circuit 70 may receive a clock signal CLK at a clock node CLK, and provide the clock signal CLK to clock nodes of the plurality of flip-flop circuits 77a to 77d. An output node of each flip-flop circuit of the plurality of flip-flop circuits 77a to 77c may be coupled to an input node of a flip-flop circuit in a next stage of the plurality of flip-flop circuits 77b to 77d, respectively, in the cascade connection. In a reset operation, for example, the flip-flop circuit 77a may provide an active pointer signal (Ptr=0) at a logic high level when a pointer count Ptr is zero, responsive to an active reset signal which is provided to a set node (SN) of the flip-flop circuit 77a. Simultaneously, in the reset operation, for example, the flip-flop circuits 77b to 77d may provide inactive pointer signals (Ptr=1, Ptr=2, Ptr=3) at a logic low level, responsive to the active reset signal provided to reset nodes (RN) of the flip-flop circuits 77b to 77d. Responsive to the clock signal CLK, the active pointer signal (Ptr=0) of the flip-flop circuit 77a may be provided to an input node of the flip-flop circuit 77b. Since the plurality of flip-flop circuits 77a to 77d may operate in synchronization with the clock signal CLK, the pointer signals (Ptr=0, Ptr=1, Ptr=2, Ptr=3) may be activated in this order.

The pointer circuit 70 may be the pointer circuit (IN) 70a or the pointer circuit (OUT) 70b. For example, the pointer circuit (IN) 70a may receive the write data strobe signal WRTCLKTSV, which is originally from the internal write data strobe signal WDQS on the IF chip 2, at a CLK node from an InClk node of the core write FIFO circuit 36. The pointer circuit 70a may provide pointer_in signals InPtr_0 (Ptr=0), InPtr_1 (Ptr=1), InPtr_2 (Ptr=2), and InPtr_3 (Ptr=3) in order to control timings of receiving data from the DIN node 341. For example, the pointer circuit (OUT) 70b may receive the WRTCLKCORE signal at a CLK node from an OutClk node of the core write FIFO circuit 36. The pointer circuit 70b may provide pointer_out signals OutPtr_0 (Ptr=0), OutPtr_1 (Ptr=1), OutPtr_2 (Ptr=2), and OutPtr_3 (Ptr=3), in order to control timings of providing the data to the DOUT node.

Figure 7D:
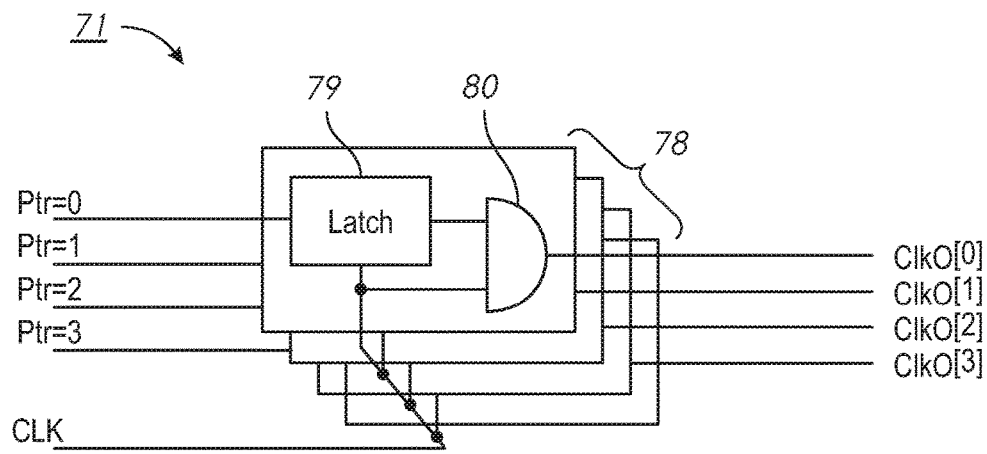
FIG. 7D is a block diagram of a clock gate block in the core write FIFO circuit, in accordance with an embodiment of the present disclosure.

The core write FIFO circuit 36 may include a clock gate block 71a coupled to the pointer circuit (IN) 70a and a clock gate block 71b coupled to the pointer circuit (OUT) 70b. FIG. 7D is a block diagram of a clock gate block 71 (e.g., the clock gate block 71a, the clock gate block 71b) in the core write FIFO circuit 36, in accordance with an embodiment of the present disclosure. For example, the clock gate block 71 may be coupled to the pointer circuit 70. The clock gate block 71 may include a plurality of clock gates 78 that receive the clock signal CLK commonly provided to the pointer circuit 70. Each clock gate of the plurality of clock gates 78 may receive a corresponding pointer signal. For example, a clock gate 78 may include a latch 79 that may receive the corresponding pointer signal and the clock signal CLK, and an AND circuit 80 that may receive an output signal from the latch 79 and the clock signal CLK. The clock gate 78 may provide a pointer-clock signal. For example, the clock gate 78 that receives the pointer signal (Ptr=0) may provide a pointer-clock signal ClkO[0]. Similarly, the clock gates 78 that receive the pointer signals (Ptr=1, Ptr=2, Ptr=3) may provide the pointer-clock signals ClkO[1], ClkO[2], ClkO[3]. Because the pointer signals (Ptr=0, Ptr=1, Ptr=2, Ptr=3) may be activated in this order, the pointer-clock signals ClkO[0], ClkO[1], ClkO[2], ClkO[3] may include a pulse signal based on a clock signal responsive to the pointer signals (Ptr=0, Ptr=1, Ptr=2, Ptr=3).

The clock gate block 71 may be the clock gate block 71a or the clock gate block 71b. For example, the clock gate block 71a may provide pointer-in-clock signals InClk_0, InClk_1, InClk_2 and InClk_3, responsive to the InClk, and the corresponding pointer_in signals InPtr_0, InPtr_1, InPtr_2, and InPtr_3, in order to control timings of receiving data from the DIN node 341. For example, the clock gate block 71b may provide pointer-out-clock signals OutClk_0, OutClk_1, OutClk_2 and OutClk_3, responsive to the Out-Clk and the corresponding pointer_out signals OutPtr_0, OutPtr_1, OutPtr_2, and OutPtr_3, in order to control timings of providing data to the DOUT node.

The core write FIFO circuit 36 may include a plurality of FIFO circuits [0] to [3] 72. The core read FIFO circuit 36 may receive the write data strobe signal WRTCLKTSV at the InClk_0 to InClk_3 nodes of the plurality of FIFO circuits [0] to [3] 72, respectively. As described earlier, the write data strobe signal WRTCLKTSV may include the first pulse for the don't care data (X) in the first cycle, the second pulse for the first and second data (A and B) to be received in the second cycle, and the third pulse for the third and fourth data (C and D) to be received in the third cycle. As described earlier, the TSV 34 may provide core data, including the don't care data (X) and the first to forth write data (A to D), on the RWBSTSV signal to the DIN node 341 of the core write FIFO circuit 36, with the delay due to the TSV 34 relative to the RWBSTSV signal, responsive to the RWBSTSV signal. For example, the FIFO circuit [0] 72 may include a plurality of flip-flop circuits 73*a* and 73*b* in a first stage and a plurality of flip flop circuits 74*a* and 74*b* in a second stage.

The flip-flop circuit 73*a* may receive the don't care data (X) and the first to forth write data (A to D) at a data input node from the DIN node 341 of the core write FIFO circuit 36, responsive to the InClk_0 signal received at a clock node of the flip-flop circuit 73*a*. The flip-flop circuit 73*a* may latch the first don't care data (X) with a delay of CWL cycles (e.g., from Time "a" to Time "b" in FIG. 7B) and may provide the first don't care data (X) as a W0R[0] signal to a data input node of the flip-flop circuit 74*a*, responsive to a rising edge of the InClk_0 signal. The flip-flop circuit 74*a* may latch the first don't care data (X) on the W0R[0] signal and may provide the first don't care data (X) as a W1R[0] signal to a multiplexer 75, responsive to a rising edge of the OutClk_0 signal received at a clock node of the flip-flop circuit 74*a*.

The flip-flop circuit 73*b* may receive the don't care data (X) and the first to forth write data (A to D) at a data input node from the DIN node 341 of the core write FIFO circuit 36, responsive to an inverted signal of the InClk_0 signal received at a clock node of the flip-flop circuit 73*b*. The flip-flop circuit 73*b* may latch the second don't care data (X) and may provide the second don't care data (X) as a W0F[0] signal to a data input node of the flip-flop circuit 74*b*, responsive to a rising edge of the inverted InClk_0 signal that corresponds to a falling edge of the InClk_0 signal. The flip-flop circuit 74*b* may latch the second don't care data (X) on the W0F[0] signal with a delay of (CWL and a half) cycles (e.g., from Time "c" to a half cycle after Time "d" in FIG. 7B) and may provide the second don't care data (X) as a W1F[0] signal to the multiplexer 75, responsive to a rising edge of an inverted signal of the OutClk_0 signal received at a clock node of the flip-flop circuit 74*b*, that corresponds to a falling edge of the OutClk_0 signal. The multiplexer 75 may provide the first don't care data (X) responsive to the rising edge of the OutClk_0 signal and the second don't care data (X) responsive to the falling edge of the OutClk_0 signal to a buffer 76. The buffer 76 may provide the first don't care data (X) and the second don't care data (X), responsive to the pointer_out signal OutPtr_0 from the pointer circuit 70*b*.

Similarly, the FIFO circuit [1] 72 may receive the don't care data (X) and the first to forth write data (A to D), responsive to the InClk_1 signal, and provide the first write data (A) and the second write data (B), responsive to a rising edge and a falling edge of the OutClk_1 signal, respectively (e.g., from Time "e" and a half cycle after Time "e" in FIG. 7B). The FIFO circuit [2] 72 may receive the don't care data (X) and the first to forth write data (A to D), responsive to the InClk_2 signal, and provide the third write data (C) and the fourth write data (D), responsive to a rising edge and a falling edge of the OutClk_2 signal, respectively. Thus, the DOUT node of the core write FIFO circuit 36 may provide the don't care data (X) and the first to forth write data (A to D) as shown in FIG. 2B and FIG. 7D to the buffer 38.

It will be understood by those skilled in the art that the IF read FIFO circuit 28 may have the similar structure as the core write FIFO circuit 36, including two stages of a plurality of flip flop circuits, one stage for receiving data and the other stage for providing the data. For example, the IF read FIFO circuit 28 may receive data from one of the core chips 3, responsive, in part, to an internal clock signal of either IF chip 2 or the one of the core chips 3. The IF read FIFO circuit 28 may provide the data to the memory controller 1, while the IF command circuit 20 may provide a clock signal and a read data strobe signal signaling timings to read the data to the memory controller 1 and the IF read FIFO circuit 28 (not shown).

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising a first chip, wherein the first chip comprises:
   a receiver configured to receive a data strobe signal and further configured to generate an internal strobe signal responsive, at least in part, to the data strobe signal, the internal strobe signal including a first edge and a second edge following the first edge;
   a buffer circuit having a data input coupled to a set of input terminals and configured to capture first data at the set of input terminals responsive, at least in part, to the first edge of the internal strobe signal and further configured to capture second data at the set of input terminals responsive, at least in part, to the second edge of the internal strobe signal;
   a driver coupled between a data output of the buffer circuit and a set of data terminals and configured to be activated to provide the first and second data from the data output of the buffer circuit to the set of data terminals responsive, at least in part, to a control signal; and
   a width expanding circuit coupled to the driver and configured to provide the control signal to the driver responsive, at least in part, to the internal strobe signal.

2. The apparatus of claim 1, further comprising a second chip stacked with the first chip via through substrate vias (TSVs), wherein the second chip comprises:
   a first-in-first-out (FIFO) circuit coupled to the set of data terminals and configured to capture the first data and the second data responsive to a signal based on the internal strobe signal from the first chip, and further configured to provide the first data and the second data responsive to an internal clock signal independent from the signal based on the internal strobe signal.

3. The apparatus of claim 1, wherein the first chip further comprises a first command circuit configured to receive a first command signal and further configured to provide a command state signal, responsive to the first command signal, and
wherein the receiver is configured to generate the internal strobe signal, further responsive to the command state signal.

4. The apparatus of claim 3, wherein the second chip further comprises a second command circuit,
wherein the second command circuit is configured to provide the internal clock signal from a first time and further configured to provide a command enable signal in an active state from a second time that is a predetermined number of cycles of the internal clock signal after the first time, responsive to the first command signal from the first command circuit.

5. The apparatus of claim 4, wherein the second chip further comprises a buffer coupled between the FIFO circuit and a read and write bus, and
wherein the buffer is configured to be activated to provide the first and second data from the buffer circuit to the read and write bus responsive, at least in part, to the command enable signal in the active state.

6. The apparatus of claim 4, wherein the second command circuit comprises a latency shifter configured to cause a first delay of the internal clock signal relative to the first command signal and further configured to cause a second delay of the command enable signal relative to the first command signal.

7. The apparatus of claim 6, wherein the first delay is an address strobe command latency.

8. The apparatus of claim 6, wherein the latency shifter comprises:
a shift register configured to provide a plurality of latency signals; and
an OR circuit configured to receive the plurality of latency signals and further configured to provide a latency sum signal that is an OR operation result of the plurality of latency signals,
wherein the internal clock signal has an active period responsive to the latency sum signal.

9. An apparatus comprising:
a memory device that comprises an interface chip and a plurality of core chips,
wherein the interface chip comprises:
a strobe receiver buffer configured to receive a data strobe signal and further configured to generate an internal strobe signal responsive, at least in part, to the data strobe signal, the internal strobe signal including a first edge and a second edge;
an interface buffer circuit having a data input coupled to a set of input terminals configured to receive data signals, the interface buffer circuit configured to capture first data at the set of input terminals responsive, at least in part, to the first edge of the internal strobe signal and further configured to capture second data at the set of input terminals responsive, at least in part, to the second edge of the internal strobe signal;
a driver coupled between a data output of the interface buffer circuit and a set of data terminals and configured to be activated to provide the first and second data from the data output of the interface buffer circuit to the set of data terminals responsive, at least in part, to a control signal; and a width expanding circuit coupled to the driver and configured to provide the control signal to the driver responsive, at least in part, to the internal strobe signal.

10. The apparatus of claim 9, wherein the width expander circuit comprises:
a delay circuit configured to provide a delay corresponding to a pulse width longer than when the internal strobe signal is active, and
an OR circuit configured to execute a logical OR operation of the internal strobe signal and an output signal of the delay circuit to provide the control signal.

11. The apparatus of claim 9, wherein the interface buffer circuit comprises:
a first flip-flop circuit configured to latch the first data, responsive to the first edge of the internal strobe signal and further configured to provide the first data at the first edge of the internal strobe signal,
a second flip-flop circuit configured to latch the second data, responsive to the second edge of the internal strobe signal and further configured to provide the second data at the second edge of the internal strobe signal, and
a multiplexer configured to receive the first data from the first flip-flop circuit and the second data from the second flip-flop circuit, and further configured to provide the first data responsive to a first state of the internal strobe signal and to provide and the second data responsive to a second state of the internal strobe signal.

12. The apparatus of claim 9, wherein the memory device is configured to receive a command signal and a clock signal,
wherein the interface chip further comprises a first command circuit comprising:
a first command decoder configured to decode the first command signal and further configured to provide an interface write command signal;
a first latency shifter configured to provide a command state signal, responsive, at least in part, to the interface write command signal and the clock signal, and
wherein the strobe receiver buffer is configured to generate the internal strobe signal, further responsive to the command state signal.

13. The apparatus of claim 12, wherein the first latency shifter comprises:
a plurality of flip-flop circuits in a cascade connection, comprising a flip-flop circuit in a first stage of the cascade connection configured to receive the interface write command signal; and
an OR circuit comprising a plurality of input nodes coupled to a plurality of corresponding output nodes of the plurality of flip-flop circuits, and
wherein the OR circuit is configured to execute a logical OR operation of signals on the plurality of nodes and further configured to provide a result of the logical OR operation as the command state signal.

14. The apparatus of claim 12, wherein each core chip of the plurality of core chips further comprises a second command circuit and a write FIFO circuit,
wherein the first command circuit is further configured to provide the first command sitmal and the clock signal to the second command circuit,
wherein the second command circuit comprises:
a second command decoder configured to decode the first command signal and further configured to provide a core write command signal;

a second latency shifter configured to provide a write internal clock signal and a write command enable signal, responsive, at least in part, to the core write command signal and the clock signal, and wherein the second command circuit is configured to provide the write command enable signal in an active state a predetermined number of cycles after providing the write internal clock signal in an active state, responsive to the first command signal.

15. The apparatus of claim 14, wherein each core chip of the plurality of core chips is stacked with the interface chip via through substrate vias (TSVs) coupled to the write FIFO circuit, and wherein the set of data terminals in the interface chip are coupled to the TSVs.

16. The apparatus of claim 14, wherein the second latency shifter comprises a plurality of flip-flop circuits in a cascade connection and an OR circuit, wherein the OR circuit comprises a first input node coupled to a first flip-flop circuit of the plurality of flip-flop circuit that is in the third to last stage in the cascade connection and a second input node coupled to a second flip-flop circuit of the plurality of flip-flop circuit that is in the second to last stage in the cascade connection, wherein the OR circuit is configured to execute a logical OR operation of signals on the first input node and the second input node, and further configured to provide a result of the logical OR operation as the write internal clock signal, and wherein a third flip flop circuit of the plurality of flip-flop circuit that is in the last stage in the cascade connection is configured to provide the write command enable signal.

* * * * *